United States Patent [19]
Yamamoto et al.

[11] Patent Number: 5,283,007
[45] Date of Patent: Feb. 1, 1994

[54] CONDUCTIVE POLYMER COMPOSITIONS

[75] Inventors: Yasuo Yamamoto, Fuchi; Akira Inaba; Takayuki Oba, both of Yokohama, all of Japan

[73] Assignee: E. I. Du Pont de Nemours and Company, Wilmington, Del.

[21] Appl. No.: 874,879

[22] Filed: Apr. 28, 1992

[51] Int. Cl.⁵ .................. H01B 1/00; H01B 1/02; H01B 1/06; H01B 1/08
[52] U.S. Cl. .................... 252/518; 252/512; 252/513; 252/520; 252/521; 106/1.13; 106/1.23
[58] Field of Search ............. 252/512, 513, 514, 518, 252/520, 521; 106/1.13, 1.18, 1.23, 1.26

[56] References Cited
U.S. PATENT DOCUMENTS

| | | | |
|---|---|---|---|
| 3,922,387 | 11/1975 | Larry | 252/514 |
| 4,075,681 | 2/1978 | Popowich | 252/514 |
| 4,493,789 | 1/1985 | Ueyama et al. | 252/512 |
| 4,595,606 | 6/1986 | St. John et al. | 252/514 |

Primary Examiner—Paul Lieberman
Assistant Examiner—M. Kopec

[57] ABSTRACT

An electrically conductive thick film resin composition comprising finely divided particles of (1) a conductive metal dispersed in a liquid organic medium comprising (2) acrylic polymer primary binder and (3) network resin auxiliary binder having a thermal degradation temperature of at least 300 C. dissolved in (4) volatile organic solvent.

3 Claims, 2 Drawing Sheets

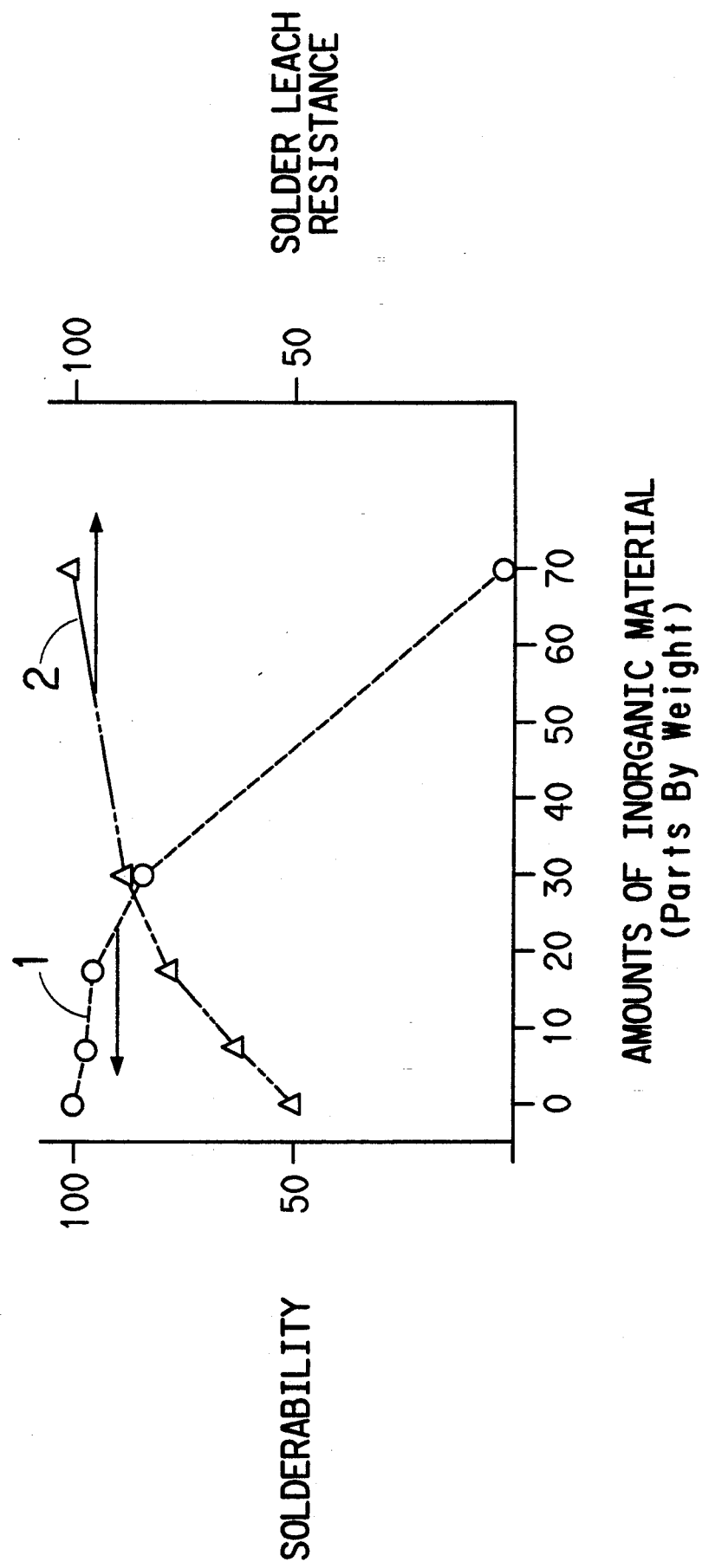

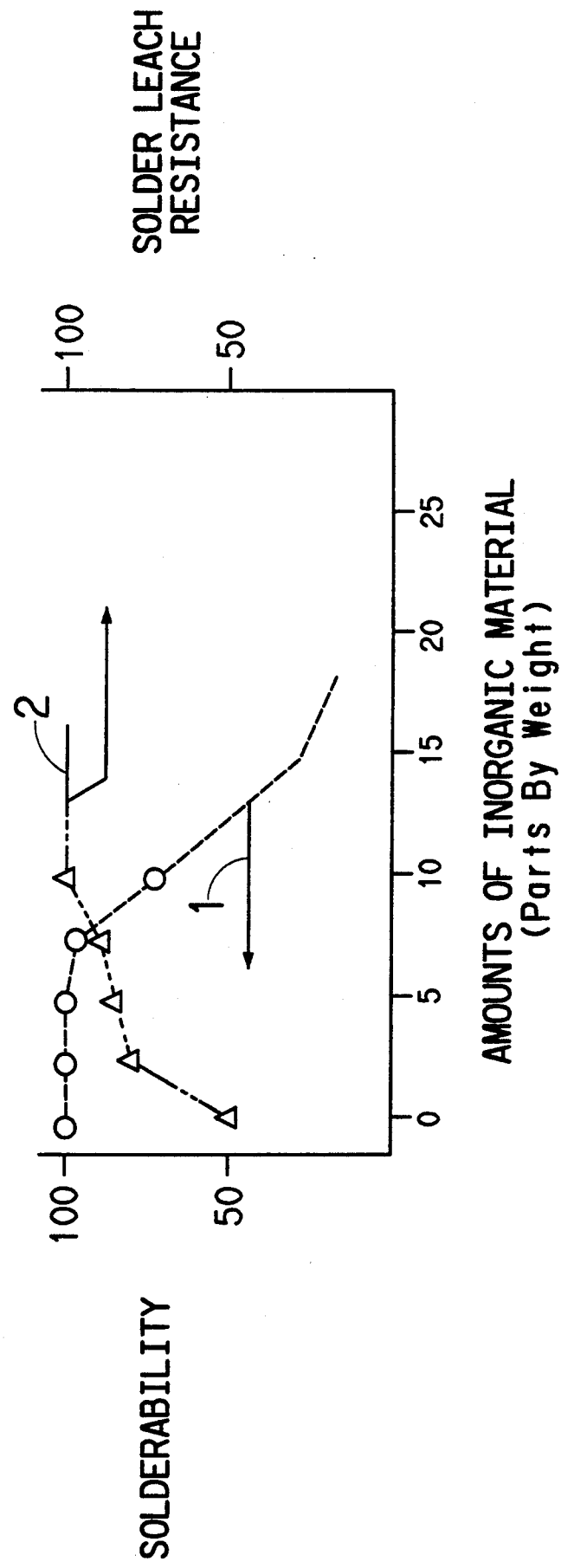

CONDUCTIVE POLYMER COMPOSITIONS

FIELD OF INVENTION

The invention is directed to electrically conductive polymer compositions which are useful for the manufacture of microcircuit components.

BACKGROUND OF THE INVENTION

Electrically conductive polymer compositions are comprised of finely divided particles of electrically conductive metals such as silver or silver alloys dispersed in an organic medium consisting of normally solid organic polymers dissolved in organic solvent. The compositions are frequently of paste consistency so that they can be applied to an appropriate substrate by screen printing. A variety of synthetic polymers have been used for this purpose, the most frequently used being acrylic polymers. Such compositions frequently employ 1-40% by weight organic polymer solids for each 100% by weight organic medium (polymer plus solvent).

Electrically conductive polymer compositions containing acrylic polymers provide good adhesion for soldered components. However, they tend to delaminate from their substrate when higher soldering temperatures are used such as 240 C. and higher.

SUMMARY OF THE INVENTION

In order to overcome the delamination problems associated with the prior art compositions, the invention is directed in its primary aspect to an electrically conductive polymer composition comprising finely divided particles of (1) electrically conductive solids selected from conductive metal(s), alloys and mixtures thereof dispersed in an organic medium comprising (2) an acrylic polymer or copolymer and (3) a network-forming polymer(s) having a thermal degradation temperature above 300 C. dissolved in (4) volatile organic solvent.

In a preferred aspect, the invention is directed to the aforementioned composition which contains in addition finely divided particles of metal oxide-based material having a softening point of at least 290 C.

BRIEF DESCRIPTION OF THE DRAWING

The Drawing consists of two Figures, both of which are graphical correlations of the solderability and solder leach resistance properties of compositions of the invention as a function of the amount of the metal oxide-containing material contained therein.

DETAILED DESCRIPTION OF THE INVENTION

A. General Discussion

One of the causes for film delamination of electrically conductive resin compositions is a severe drop in the viscosity of the acrylic resin which liquifies when exposed to temperatures of 200 C. or higher. It was therefore quite unexpected to find that the addition of particulate metal oxide-based materials in combination with more highly thermal resistance polymers resulted in suppression of the polymer's flow during soldering. This phenomenon was especially unexpected in view of the fact that glass transition of the acrylic resins is usually on the order of 110 C. or less. The metal oxide-containing inorganic material and the high temperature resistant polymer components of the invention are postulated to improve soldering resistance while the resin temperature is raised to a high temperature by simultaneously covering the surface of the conductive filler, such as a silver powder, or the like, thereby decreasing the contact area between the silver powder and the like with the solder. A soldering step is known to involve some migration of the silver powder in the electrically conducting polymer compositional film to the film surface when it comes in contact with the solder, where the migration of the silver powder also causes the polymer itself to migrate towards the film surface. Therefore, covering the silver powder surface reduces the amount of the silver, which would migrate to the film surface and come in contact with the solder, thereby suppressing the migration of the resin as well, which conceivably retards the film from delaminating from the base material. As is evident with this, the acrylic or network-forming resin must liquefy to some extent to permit the silver powder to come in contact with the solder in order for the solder to adhere to the film of the electrically conducting resin composition. Therefore, the amount of the inorganic or organic material added is defined as the range over which the resin can liquefy to some extent at the high temperature. Following is a detailed description of these inorganic and organic materials.

B. Acrylic Polymer Component

Both homopolymers and copolymers of various ethylenically unsaturated acrylic monomers can be used as the primary binder resin for the compositions of the inventions. As used herein, the term "acrylic" includes methacrylic as well as acrylic resins and the term "polymer" includes copolymers and multipolymers as well. Either acrylic polymers or network-forming polymers can be used as the polymer component of the invention. Suitable acrylic polymers include polymers and copolymers of methyl methacrylate. It is not essential that the acrylic polymers have a high thermal degradation temperature, nevertheless it is quite desirable that they do so.

The amount of primary binder in the compositions of the invention should be at least 6 parts by weight, basis 100 parts of conductive metal, in order adequately to bind the particulate solids. However, no more than 30 parts by weight primary binder should be used lest the conductive of the composition be lowered excessively.

C. Heat Resistant Polymer Component

It is preferred that the heat-resistant polymer component of the invention composition contain 12-200 carbon atoms per molecule and it is essential that the polymer resist thermal degradation up to a temperature at least 300 C. and preferably 350 C. A thermal degradation of 450 C. or higher is still further preferred. Network-forming polymers are particularly useful for this function. These include phenol novolak polymers, phenoxy resins and modified rosin polymers. Epoxy resins and melamine resins can also be used for this purpose.

These polymers are used in the compositions of the invention, preferably in an amount preferably of 2-40 parts by weight per 100 parts by weight of the conductive filler. A level smaller than this range fails to sufficiently improve soldering resistance, while a greater level creates problems in soldering adhesion or resistance values. It is preferred that the network resin be used in amounts corresponding to 3-10 parts by weight, basis 100 parts by weight of the conductive metal particles. The amount of organic material used is selected to be optimum depending upon the type of the organic material used within the above range in accordance with the application of the electrically conducting resin composition.

As used herein, the terms "polymer" and "resin" are interchangeable.

D. Metal Oxide-Based Material

The metal oxide-based inorganic materials used in the invention are metal oxides such as $TiO_2$, $Al_2O_3$, NiO, mica and metal oxide glasses such as lead borosilicates. These inorganic materials may be used in a mixture. The inorganic material preferably is a particulate material having an average particle size of not more than 10 um. A material having a greater size will result in a problem of roughness of the film surface. The amount of an inorganic material added is preferably 3-50 parts by weight per 100 parts by weight of the conductive filler. A level less than 3 parts by weight makes the soldering resistance insufficient, while a level greater than 50 parts by weight will give poor soldering adhesion. Oxides of the alkali metals and cadmium are, however, excluded herefrom. Oxides of the alkaline earth metals may be used in the invention so long as they have melting points above 290 C. It is preferred that the metal oxide-based particles be used in amounts corresponding to 10-40 parts by weight, basis 100 parts by weight of the conductive metal particles. The particle size of the metal oxide-based particles should be within the range of 0.1-20 micrometers and preferably 0.5-10 micrometers.

E. Conductive Metal

The invention can be used with a large variety of conductive materials including Au, Ag, Pd, Cu, Ni and alloys and mixtures thereof. The particle size of the conductive metal particles should be within the range of 0.1-20 micrometers and preferably 0.5-10 micrometers.

F. Solvent

The solvents which can be used in the liquid media for the compositions of the invention are the same as those which are used in conventional thick film pastes. That is, a wide variety of inert liquid solvents may be used as the liquid organic medium. Exemplary of such liquids are aliphatic alcohols, esters of such alcohols, terpenes and solvents such as the monobutyl ether of ethylene glycol monoacetate.

The ratio of liquid organic medium to solids in the dispersions of the invention can vary considerably and depends upon the manner in which the dispersion is to be applied and the kind of organics used. Normally to achieve good coverage the dispersions will contain complementally 60-95% solids and 40-5% total liquid medium. The organic media used in the invention may, of course, be modified by the addition of secondary additive materials such as thixotropic agents, plasticizers, surfactants and the like so long as the above-referred basic proportions of the primary materials are maintained.

The compositions of the invention can be made in the manner of conventional thick film pastes by admixing the inorganic particles with the liquid medium components and then milling the admixture to obtain a fine dispersion of the solids having suitable consistency and rheology for screen printing.

EXAMPLES

Examples 1-5

A series of five conducting resin compositions was prepared by adding the inorganic material, $TiO_2$, in various amounts as given in Table 1 to a silver acrylic type electrically conducting composition. The amount of $TiO_2$ indicated in Table 1 represents parts by weight per 100 parts by weight of the silver powder. Examples 1-5 used a methyl methacrylic resin as the acrylic resin component and butyl Cellosolve acetate as the solvent. The methyl methacrylate resin was used in an amount of 6.7 parts per 100 parts by weight of the silver powder; butyl Cellosolve acetate was used in an amount of 13.3 parts by weight per 100 parts by weight of the silver powder.

These compositions were evaluated for their soldering adhesion and resistance to solder by the following procedure. First, the electrically conducting resin compositions were printed onto alumina substrates ($Al_2O_3$, 96%) so as to give a dry film thickness of 10-30 $\mu$m, dried for 60 minutes at 150°C. and dipped together with the substrates for 2 seconds in a Pb/Sn eutectic solder (Pb/Sn=40/60), followed by measuring the area of remaining film on the substrate and the area of solder adhered to the film. The solder adhesion was rated by (the area of the solder adhered to the film)/(the area of remaining film on the substrate)×100: the solder resistance was rated by (the area of the remaining film on the substrate/(the area of the film on the baseboard before dipping in the solder)×100. The results obtained are given in FIG. 1. In FIG. 1, curve 1 shows a change in solder adhesion; curve 2 shows the change in solder resistance.

TABLE 1

| Example No. | Amount of $TiO_2$ Added Per 100 Parts by Wt. of Silver |
| --- | --- |
| 1 | 0.0 Parts by Weight |
| 2 | 7.6 Parts by Weight |
| 3 | 17.2 Parts by Weight |
| 4 | 29.6 Parts by Weight |
| 5 | 68.8 Parts by Weight |

EXAMPLES 6-10

The same silver acrylic electrically conducting resin composition as that used in Examples 1-5 was mixed with various amounts, as shown in Table 2, of a phenol novolak resin as an organic material component to prepare electrically conducting resin compositional samples 6-10. In Table 2, the amount of the phenol novolak resin added is based on parts by weight per 100 parts by weight of the silver powder. These compositions, similar to those of Examples 1-5, were also evaluated for solder adhesion and resistance to solder. The results are given in FIG. 2. In FIG. 2, curve 1 shows the change in solder adhesion; curve 2 shows the change in solder resistance.

TABLE 2

| Example No. | Amount of $TiO_2$ Added Per 100 Parts by Wt. of Silver |
| --- | --- |
| 6 | 0.0 Parts by Weight |
| 7 | 2.5 Parts by Weight |
| 8 | 5.0 Parts by Weight |
| 9 | 7.5 Parts by Weight |
| 10 | 10.0 Parts by Weight |

The results shown in FIGS. 1 and 2 demonstrate that a suitable selection with respect to the amount of an inorganic material and organic material added makes it possible to produce an electrically conducting resin composition film with improved solder resistance, while still maintaining good solder adhesion.

We claim:

1. An electrically conductive thick film resin composition comprising finely divided particles of (1) a conductive metal dispersed in a liquid organic medium comprising, on a basis of 100 parts by weight of conductive metal, (2) 6–30 parts of acrylic polymer primary binder, (3) 2–40 parts of network resin auxiliary binder having a thermal degradation temperature of at least 300 C., and (4) 3–50 parts of finely divided particles of metal oxide-based material having a softening point of at least 290 C., selected from the group consisting of metal oxide-based glass, $TiO_2$, $Al_2O_3$, and mixtures thereof dissolved in (5) volatile organic solvent.

2. The composition of claim 1 in which the auxiliary binder is selected from phenol novolak resin, phenoxy resin, modified rosin resin, epoxy resins, melamine resins, and mixtures thereof.

3. A conductive pattern made by screen printing a pattern of the paste composition of claim 1 onto a substrate and heating the composition at an elevated temperature for a time sufficient to remove the volatile solvent therefrom by evaporation.

* * * * *